United States Patent
Lee

(10) Patent No.: US 11,100,997 B2
(45) Date of Patent: Aug. 24, 2021

(54) STORAGE DEVICE, CONTROLLER AND METHOD FOR OPERATING CONTROLLER FOR CONFIGURING SUPER PAGES USING PROGRAM TIMING INFORMATION

(71) Applicant: SK hynix Inc., Gyeonggi-do (KR)

(72) Inventor: Jin-Suk Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/685,405

(22) Filed: Nov. 15, 2019

(65) Prior Publication Data

US 2020/0350017 A1 Nov. 5, 2020

(30) Foreign Application Priority Data

Apr. 30, 2019 (KR) .................. 10-2019-0050357

(51) Int. Cl.
| | | |
|---|---|---|
| *G11C 16/10* | (2006.01) | |
| *G11C 16/08* | (2006.01) | |
| *G11C 16/32* | (2006.01) | |
| G11C 16/04 | (2006.01) | |

(52) U.S. Cl.
CPC .............. *G11C 16/10* (2013.01); *G11C 16/08* (2013.01); *G11C 16/32* (2013.01); *G11C 16/0483* (2013.01)

(58) Field of Classification Search
CPC ......... G11C 16/10; G11C 16/08; G11C 16/32; G11C 16/0483
See application file for complete search history.

(56) References Cited

U.S. PATENT DOCUMENTS

| | | | | |
|---|---|---|---|---|
| 9,141,475 B2* | 9/2015 | Alrod | .................. | G06F 11/1068 |
| 9,298,534 B2* | 3/2016 | Miyamoto | ............ | G06F 11/073 |
| 9,639,462 B2* | 5/2017 | Camp | ................. | G06F 12/0246 |
| 9,679,657 B2* | 6/2017 | Park | ....................... | G11C 16/10 |
| 10,366,771 B2* | 7/2019 | Takizawa | ............ | G06F 11/3055 |

FOREIGN PATENT DOCUMENTS

| | | |
|---|---|---|
| KR | 10-2011-0103142 | 9/2011 |
| KR | 10-2011-0119328 | 11/2011 |
| KR | 10-2018-0102241 | 9/2018 |

\* cited by examiner

*Primary Examiner* — Vanthu T Nguyen
(74) *Attorney, Agent, or Firm* — IP & T Group LLP

(57) ABSTRACT

The disclosure relates to a storage device, a controller and a method for operating a controller. The controller described in embodiments of the disclosure may include a word line grouping circuit configured to group a plurality of word lines in a semiconductor memory device into a plurality of word line groups based on program time information on program times of the respective word lines. Also, the controller may include a super page configuration circuit configured to configure a plurality of super pages including some of the word lines, based on word line group information on the word line groups. Embodiments of the disclosure may provide a storage device, a controller and a method for operating a controller, capable of minimizing program performance degradation that may occur due to deviations in program time among word lines.

13 Claims, 10 Drawing Sheets

FIG. 4

| | DIE0 | | | | DIE1 | | | | DIE2 | | | | DIE3 | | | |
|---|---|---|---|---|---|---|---|---|---|---|---|---|---|---|---|---|
| | Plane0 | Plane1 | Plane2 | Plane3 | Plane0 | Plane1 | Plane2 | Plane3 | Plane0 | Plane1 | Plane2 | Plane3 | Plane0 | Plane1 | Plane2 | Plane3 |
| WL0 | | | | | | | | | | | | | | | | |
| WL1 | | | | | | | | | | | | | | | | |
| WL2 | | | | | | | | | | | | | | | | |
| WL3 | | | | | | | | | | | | | | | | |
| WL4 | | | | | | | | | | | | | | | | |
| WL5 | | | | | | | | | | | | | | | | |
| WL6 | | | | | | | | | | | | | | | | |
| WL7 | | | | | | | | | | | | | | | | |
| ... | | | | | | | | | | | | | | | | |

↑ SP0  ↑ SP1  ↑ SP2  ↑ SP3  ↑ SP4

STORAGE DEVICE, CONTROLLER AND METHOD FOR OPERATING CONTROLLER FOR CONFIGURING SUPER PAGES USING PROGRAM TIMING INFORMATION

CROSS-REFERENCE TO RELATED APPLICATION

The present application claims priority to Korean Patent Application No. 10-2019-0050357, filed in the Korean Intellectual Property Office on Apr. 30, 2019, which is incorporated herein by reference in its entirety.

BACKGROUND

1. Technical Field

Various embodiments generally relate to a storage device, a controller and a method for operating a controller.

2. Related Art

A storage device stores data based on a request of a host such as a computer and a smartphone. The storage device may be a type that stores data in a magnetic disk, such as a hard disk drive (HDD), or a type that stores data in a nonvolatile memory, such as a solid state drive (SDD), a universal flash storage (UFS) device or an embedded MMC (eMMC) device.

A nonvolatile memory which is used by a storage device to store data may include a plurality of word lines. Among these word lines, there exist deviations in a characteristic related with read/program. Such deviations occur during manufacturing of the nonvolatile memory, and may increase in proportion to a storage capacity of the nonvolatile memory.

SUMMARY

Various embodiments are directed to a storage device, a controller and a method for operating a controller, capable of minimizing program performance degradation that may occur due to deviations in program time among word lines.

In one aspect, a controller to be described in embodiments of the disclosure may include a word line grouping circuit configured to group a plurality of word lines in a semiconductor memory device, into a plurality of word line groups based on program time information on program times of the respective word lines.

Also, the controller may include a super page configuration circuit configured to configure a plurality of super pages including some of the word lines, based on word line group information on the word line groups.

In another aspect, a storage device to be described in embodiments of the disclosure may include a semiconductor memory device including a plurality of word lines.

Also, the storage device may include a controller configured to control the semiconductor memory device, and the controller may include a word line grouping circuit configured to group the plurality of word lines in the semiconductor memory device, into a plurality of word line groups based on program timing information on program times of the respective word lines.

Further, the controller included in the storage device may include a super page configuration circuit configured to configure a plurality of super pages including some of the word lines, based on word line group information on the word line groups.

In still another aspect, a method for operating a controller to be described in embodiments of the disclosure may include grouping a plurality of word lines in a semiconductor memory device into a plurality of word line groups based on program timing information on program times of the respective word lines.

Also, the method for operating a controller may include configuring a plurality of super pages including some of the word lines, based on word line group information on the word line groups, wherein word lines in any one super page belong to the same word line group.

The program timing information may include program pulse count values.

The configuring of the plurality of super pages may include configuring, as a dummy word line, at least one of word lines not included in any one of the super pages, among the plurality of word lines.

The dummy word line may belong to a word line group different from a reference word line group to which a reference word line belongs, the reference word line corresponding to the same word line index as the dummy word line is included in any one of the plurality of super pages.

When programming dummy data to the dummy word line, a number of program pulses to be applied to the dummy word line is less than or equal to a threshold pulse count.

The configuring of the plurality of super pages may include selecting a replacement word line for a bad word line in a word line group to which the bad word line belongs when one among word lines which configure any one super page is the bad word line.

In still another aspect, a storage device to be described in embodiments of the disclosure may include a memory device including a plurality of memory cells coupled to a plurality of word lines.

Further, a storage device may include a controller determining program pulses to be applied to the word lines respectively; grouping the plurality of word lines into a plurality of groups based on the program pulses; configuring a super page including cells coupled to selected word lines in each of the groups; and programming data on the super page.

Embodiments of the disclosure may provide a storage device, a controller and a method for operating a controller, capable of minimizing program performance degradation that may occur due to deviations in program time among word lines.

BRIEF DESCRIPTION OF THE DRAWINGS

FIG. 4 is a diagram illustrating an example of configuring a conventional super page.

DETAILED DESCRIPTION

A storage device, a controller and a method for operating a controller are described below in detail with reference to the accompanying drawings through various embodiments. It is noted that, throughout the specification, reference to "an embodiment," "another embodiment" or the like is not necessarily to only one embodiment, and different references to any such phrase are not necessarily to the same embodiment(s).

Figure 1:
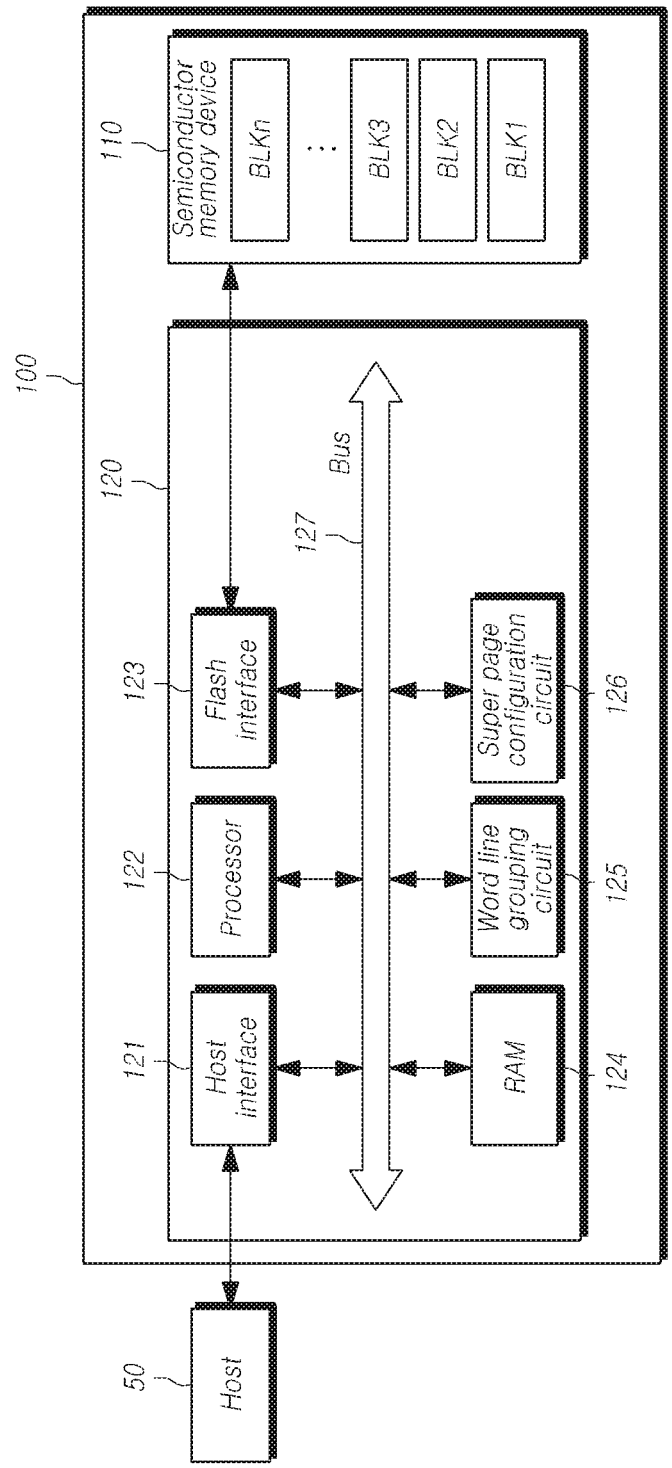
FIG. 1 is a diagram illustrating a configuration of a storage device in accordance with an embodiment.

FIG. 1 is a diagram illustrating a configuration of a storage device 100 in accordance with an embodiment.

Referring to FIG. 1, the storage device 100 may include a semiconductor memory device 110 and a controller 120.

The semiconductor memory device 110 may store data. The semiconductor memory device 110 operates in response to the control of the controller 120. The semiconductor memory device 110 may include a memory cell array including a plurality of memory cells which store data.

The semiconductor memory device 110 may be a double data rate (DDR) synchronous dynamic random access memory (DDR SDRAM), a low power double data rate 4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM) or a spin transfer torque random access memory (STT-RAM).

The semiconductor memory device 110 may be realized as a three-dimensional array structure. Embodiments of the disclosure may be applied to not only a flash memory device in which a charge storage layer is configured by a conductive floating gate (FG) but also a charge trap flash (CTF) in which a charge storage layer is configured by a dielectric layer.

The semiconductor memory device 110 is configured to receive a command and an address from the controller 120 and access a region selected by the address in the memory cell array. In other words, the semiconductor memory device 110 may perform an operation, corresponding to the command, for a region selected by the address.

For example, the semiconductor memory device 110 may perform a program operation, a read operation and an erase operation. In the program operation, the semiconductor memory device 110 may program data to a region selected by the address. In the read operation, the semiconductor memory device 110 may read data from a region selected by the address. In the erase operation, the semiconductor memory device 110 may erase data stored in a region selected by the address.

The semiconductor memory device 110 may include therein a plurality of, e.g., n, memory blocks, where n is a natural number. Such memory blocks may be designated by the reference symbols BLK1, BLK2, . . . , BLKn, respectively.

The semiconductor memory device 110 may include a plurality of memory dies, each memory die may include a plurality of planes, and each plane may include a plurality of memory blocks.

Each of memory blocks in the semiconductor memory device 110 may include a plurality of word lines. One word line may represent the unit by which read and/or program is performed, and may correspond to one page.

The controller 120 may control the operation of the semiconductor memory device 110 according to a request of a host 50 or in the absence of a request of the host 50. For example, the controller 120 may control write, read, erase and background operations for the semiconductor memory device 110. For example, the background operation may include a garbage collection (GC) operation, a wear leveling (WL) operation, a bad block management (BBM) operation, or the like.

The controller 120 may include a host interface 121, a processor 122, a flash interface 123, a random access memory (RAM) 124, a word line grouping circuit 125, a super page configuration circuit 126, and a bus 127.

The host interface 121 provides an interface for communication with the host 50. When receiving a command from the host 50, the controller 120 may receive the command through the host interface 121, and then, may perform an operation of processing the received command.

The processor 122 may control general operations of the controller 120, and may perform a logic calculation. The processor 122 may communicate with the host 50 through the host interface 121, and may communicate with the semiconductor memory device 110 through the flash interface 123.

The processor 122 may perform the function of a flash translation layer (FTL). The processor 122 may translate a logical block address (LBA) provided by the host 50, into a physical block address (PBA), through the flash translation layer (FTL). The flash translation layer (FTL) may receive the logical block address (LBA) and translate it into the physical block address (PBA), by using a map table. There are various address mapping methods of the flash translation layer, depending on a mapping unit. Representative address mapping methods include a page mapping method, a block mapping method and a hybrid mapping method.

The processor 122 is configured to randomize data received from the host 50. For example, the processor 122 may randomize data received from the host 50 by using a randomizing seed. Randomized data as data to be stored is provided to the semiconductor memory device 110 and is programmed to the memory cell array.

The processor 122 is configured to derandomize data received from the semiconductor memory device 110 in a read operation. For example, the processor 122 may derandomize data received from the semiconductor memory device 110 by using a derandomizing seed. Derandomized data may be outputted to the host 50.

The processor 122 may drive firmware loaded in the RAM 124 upon booting to control general operations of the controller 120 and perform a logic calculation.

The flash interface 123 provides an interface for communication with the semiconductor memory device 110.

The RAM 124 may store a firmware, a program code, a command or data necessary to drive the controller 120. The RAM 124 may be an SRAM or a DRAM.

The word line grouping circuit 125 may group a plurality of word lines in the semiconductor memory device 110, into a plurality of word line groups based on information on program times of the respective word lines.

A time required to program data in each of the plurality of word lines in the semiconductor memory device 110, that is, a program time tPROG, differs from word line to word line. For example, when the semiconductor memory device 110 is a 3D NAND flash, as the number of stacks configuring the 3D NAND flash increases (e.g., 32 stacks->64 stacks->96 stacks->...), deviations in program time among word lines further increase.

The above-described deviations in program time among word lines may serve as a cause that decreases program performance in the case where program is performed on a super page basis in the above-described flash translation layer (FTL).

A super page may include a plurality of word lines. The super page is a logical page, and word lines in one super page do not need to be necessarily physically adjacent to one another. Therefore, respective word lines in one super page may be different from one another in terms of a characteristic (e.g., a program time). Further, the number of word lines in one super page may be dynamically changed, and word lines in one super page may be dynamically changed.

A super page may be configured by any of various methods based on a specific criterion (e.g., an index of a memory die or block to which each word line belongs). For instance, each of word lines configuring a super page may be included in different memory dies, respectively.

In this regard, in the case where a super page is configured based on an index of a memory die or block to which each word line belongs or an index of each word line, without considering deviations in program times of respective word lines, the program performance of the super page may be degraded.

For example, it is assumed that four word lines A, B, C and D are included in one super page SP.

If a program time of the word lines A, B and C is t and a program time of the word line D is T (where T>t), a total program time of programming data to the super page SP is determined by the program time T of the word line D. This is because, when the data is programmed to the super page SP, the data is distributedly programmed to the respective word lines therein and a program operation for the entire super page SP is completed when data is completely programmed to the word line with the longest program time, word line D in this example.

In this way, in the case where program times of word lines in one super page are different, since a program time of the super page is determined by a word line of which the program time is longest, the overall program performance of the super page is degraded.

To avoid or minimize such degradation, it is necessary to minimize deviations in program time among word lines configuring one super page.

To this end, the word line grouping circuit 125 may group the plurality of word lines in the semiconductor memory device 110, into a plurality of word line groups based on information on program times of the respective word lines.

For instance, the word line grouping circuit 125 may group a plurality of word lines based on K threshold time values, where K is a natural number. In detail, assuming that the K number of threshold time values are Th1, Th2, . . . , ThK (where Th1<Th2<. . . <ThK), the word line grouping circuit 125 may group word lines of which the program times are less than or equal to Th1 into a first word line group. Further, the word line grouping circuit 125 may group word lines of which the program times exceed Th1 and are less than Th2 into a second word line group. Furthermore, the word line grouping circuit 125 may group word lines of which the program times exceed Th2 and are less than Th3 into a third word line group. By repeating this process until word lines of which the program times exceed ThK are grouped into a (K+1)th word line group, the word line grouping circuit 125 may group the plurality of the word lines.

For another instance, the word line grouping circuit 125 may set K threshold time ranges, where K is a natural number, and may group word lines of which the program times belong to a particular threshold time range, into one word line group. In detail, the word line grouping circuit 125 may group word lines of which the program times are within Th1 to Th1' into a first word line group. Further, the word line grouping circuit 125 may group word lines of which the program times are within Th2 to Th2' into a second word line group. The word line grouping circuit 125 may repeat this process until word lines of which the program times are within ThK to ThK' are grouped into a Kth word line group.

If word lines are grouped as in the above-described instances, the program times of word lines which belong to the same word line group are similar to one another. Thus, if a super page is configured only by word lines which belong to one word line group, deviations in program time among the word lines which configure the super page may be minimized.

The super page configuration circuit 126 may configure a plurality of super pages including some among the plurality of word lines in the semiconductor memory device 110, based on information on the word line groups generated by the word line grouping circuit 125. Word lines in one super page may belong to the same word line group.

An example in which the super page configuration circuit 126 configures a plurality of super pages including some among the plurality of word lines in the semiconductor memory device 110 will be described later in detail with reference to FIGS. 4 to 7.

The word line grouping circuit 125 and the super page configuration circuit 126 described above may be integrated into one module.

Alternatively, the word line grouping circuit 125 and the super page configuration circuit 126 may be realized by one processing unit which is integrated with the processor 122.

Alternatively, the word line grouping circuit 125 and the super page configuration circuit 126 may be realized in a scheme in which the processor 122 executes firmware including a command instructing operations of the word line grouping circuit 125 and the super page configuration circuit 126.

The bus 127 may be configured to provide channels among the components of the controller 120.

Figure 2:
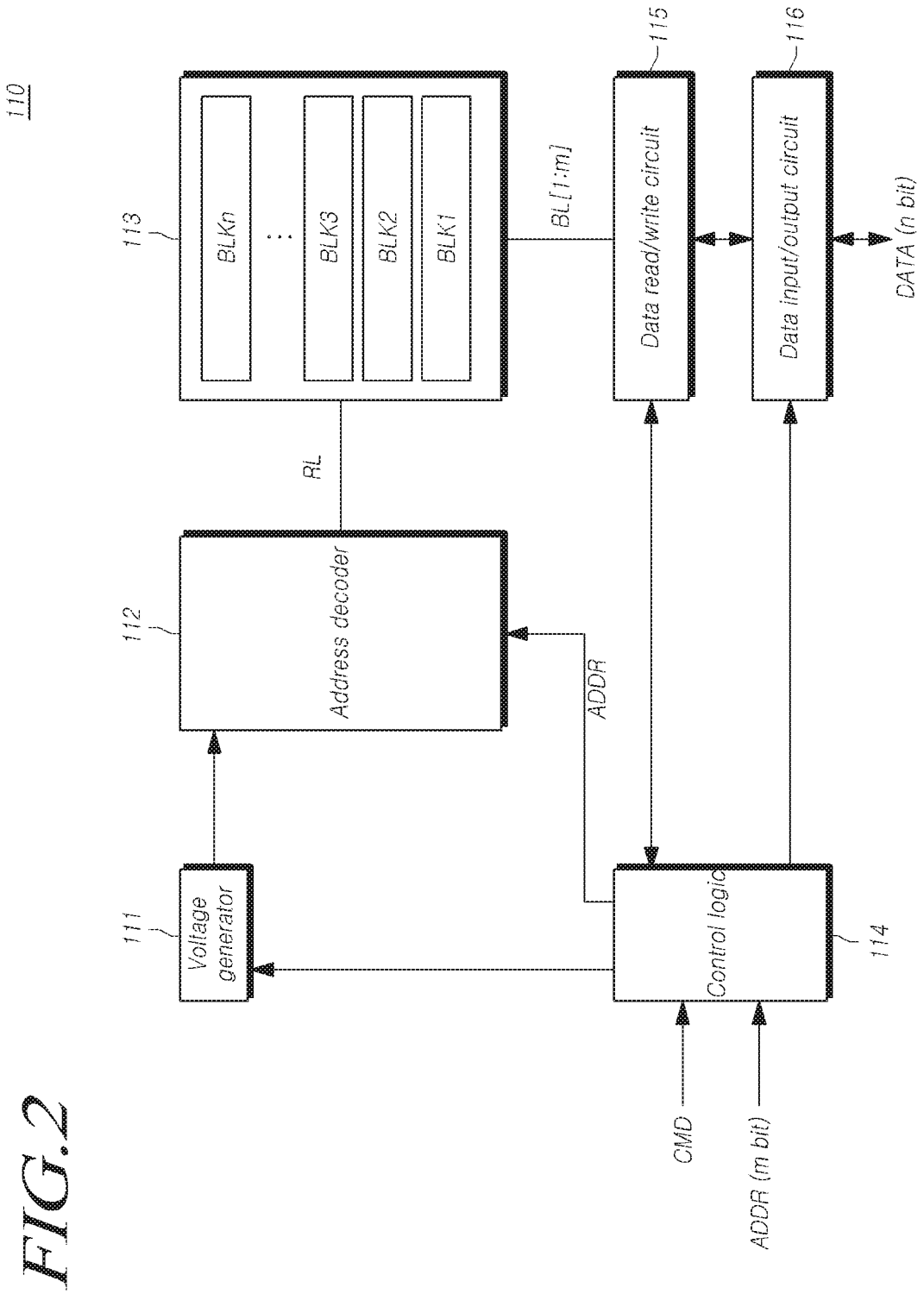
FIG. 2 is a diagram illustrating the semiconductor memory device in FIG. 1.

FIG. 2 is a diagram illustrating the semiconductor memory device 110 in FIG. 1.

Referring to FIG. 2, the semiconductor memory device 110 may include a voltage generator 111, an address decoder 112, a memory cell array 113, control logic 114, a data read and write (read/write) circuit 115 and a data input and output (input/output) circuit 116.

The memory cell array 113 includes a plurality of memory blocks. The plurality of memory blocks are coupled to the address decoder 112 through row lines RL. The plurality of memory blocks are coupled to the data read/write circuit 115 through bit lines BL[1:m].

As described above with reference to FIG. 1, each of the plurality of memory blocks may include a plurality of word lines, and a plurality of super pages including some among a plurality of word lines may be configured by the super page configuration circuit 126 of the controller 120.

Each of the plurality of memory blocks includes a plurality of memory cells. The plurality of memory cells may be volatile memory cells or nonvolatile memory cells. Among the plurality of memory cells, memory cells which are coupled to the same word line are defined as one page. That is to say, the memory cell array 113 may be configured by a plurality of pages.

Each of the plurality of memory blocks in the memory cell array 113 may include a plurality of dummy cells. At least one of the dummy cells may be coupled in series between a drain select transistor and memory cells and between a source select transistor and memory cells.

Each of the memory cells in the memory cell array 113 may be configured as a single level cell (SLC) storing one data bit, a multi-level cell (MLC) storing two data bits, a triple level cell (TLC) storing three data bits or a quad level cell (QLC) storing four data bits.

The address decoder 112 is coupled to the memory cell array 113 through the row lines RL. The row lines RL may include drain select lines, word lines, source select lines and a common source line.

The address decoder 112 is configured to operate in response to the control of the control logic 114. The address decoder 112 receives an address ADDR from the control logic 114.

The address decoder 112 is configured to decode a block address in the received address ADDR. The address decoder 112 selects at least one memory block among the memory blocks depending on the decoded block address. The address decoder 112 is configured to decode a row address in the received address ADDR. The address decoder 112 may apply voltages provided from the voltage generator 111, to at least one word line WL, depending on the decoded row address, and thereby, may select at least one word line in the selected memory block.

In a program operation, the address decoder 112 may apply a program voltage to a selected word line and may apply a pass voltage less than the program voltage to unselected word lines. In a program verify operation, the address decoder 112 may apply a verify voltage to the selected word line and may apply a verify pass voltage greater than the verify voltage to the unselected word lines.

In a read operation, the address decoder 112 may apply a read voltage to a selected word line and may apply a pass voltage greater than the read voltage to unselected word lines.

An erase operation of the semiconductor memory device 110 is performed on a memory block basis. The address ADDR inputted to the semiconductor memory device 110 in the erase operation includes a block address. The address decoder 112 may decode the block address, and may select one memory block depending on the decoded block address. In the erase operation, the address decoder 112 may apply a ground voltage to word lines which are coupled to a selected memory block.

The address decoder 112 may be configured to decode a column address in the received address ADDR. The decoded column address (DCA) may be transferred to the data read/write circuit 115. For instance, the address decoder 112 may include components such as a row decoder, a column decoder and an address buffer.

The voltage generator 111 is configured to generate a plurality of voltages by using an external power supply voltage supplied to the semiconductor memory device 110. The voltage generator 111 operates in response to the control of the control logic 114.

The voltage generator 111 may generate an internal power supply voltage by regulating the external power supply voltage. The internal power supply voltage generated by the voltage generator 111 is used as an operating voltage of the semiconductor memory device 110.

The voltage generator 111 may generate a plurality of voltages by using the external power supply voltage or the internal power supply voltage. The voltage generator 111 may be configured to generate various voltages for the semiconductor memory device 110. For example, the voltage generator 111 may generate a plurality of program voltages, a plurality of pass voltages, a plurality of selected read voltages and a plurality of unselected read voltages.

For example, the voltage generator 111 may include a plurality of pumping capacitors which receive the internal power supply voltage. The voltage generator 111 may generate the plurality of voltages by selectively activating the plurality of pumping capacitors in response to the control of the control logic 114. The plurality of generated voltages may be supplied to the memory cell array 113 by the address decoder 112.

The data read/write circuit 115 may include first to m-th page buffers, which are coupled to the memory cell array 113 through the first to m-th bit lines BL[1:m], respectively. The first to m-th page buffers operate in response to the control of the control logic 114.

The first to m-th page buffers perform data communication with the data input/output circuit 116. In a program operation, the first to m-th page buffers receive data DATA to be stored, through the data input/output circuit 116.

In the program operation, the first to m-th page buffers may transfer the data DATA to be stored, that is, the data DATA received through the data input/output circuit 116, to selected memory cells through bit lines BL, when a program pulse is applied to a selected word line. The memory cells of a selected page are programmed according to the transferred data DATA. A memory cell coupled with a bit line to which a program permission voltage (for example, a ground voltage) is applied may have an increased threshold voltage. The threshold voltage of a memory cell coupled with a bit line to which a program inhibition voltage (for example, a power supply voltage) is applied may be retained. In a program verify operation, the first to m-th page buffers read page data through the bit lines BL from the selected memory cells.

In a read operation, the data read/write circuit 115 reads data DATA through bit lines BL from the memory cells of a selected page, and outputs the read data DATA to the data input/output circuit 116.

In an erase operation, the data read/write circuit 115 may float the bit lines BL. As an embodiment, the data read/write circuit 115 may include a column select circuit.

The data input/output circuit 116 is coupled to the first to m-th page buffers through data lines. The data input/output circuit 116 operates in response to the control of the control logic 114.

The data input/output circuit 116 may include a plurality of input/output buffers (not illustrated) which receive data to be inputted. In a program operation, the data input/output circuit 116 receives data DATA to be stored, from an external controller (not illustrated). In a read operation, the data input/output circuit 116 outputs data transferred from the first to m-th page buffers in the data read/write circuit 115, to the external controller.

The control logic 114 may be coupled to the address decoder 112, the voltage generator 111, the data read/write circuit 115 and the data input/output circuit 116. The control logic 114 may be configured to control general operations of the semiconductor memory device 110. The control logic 114 may operate in response to a command CMD received from an external device.

Figure 3:
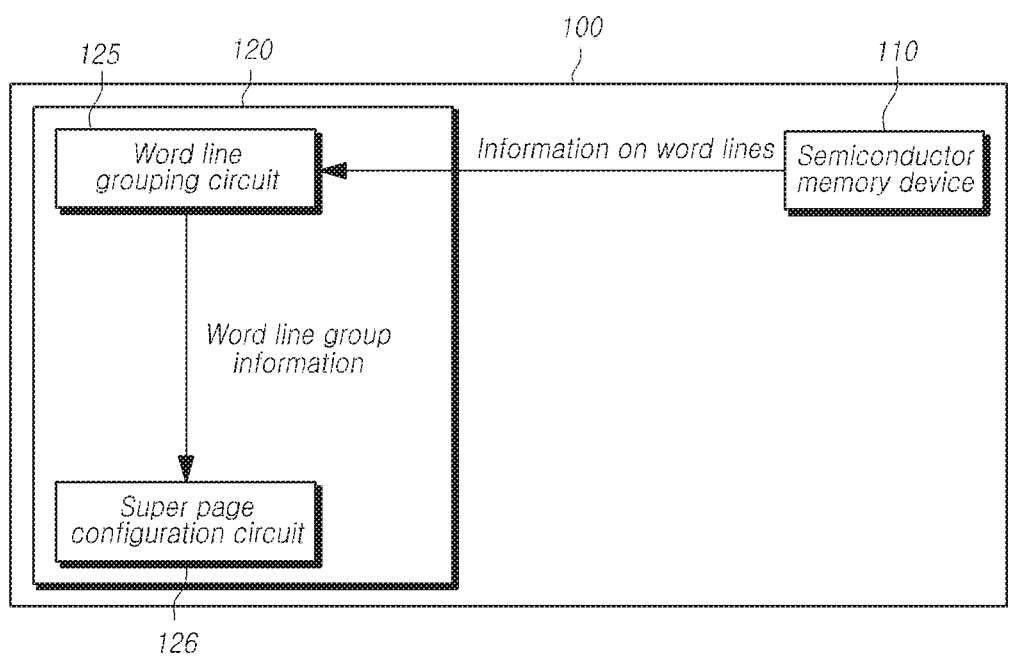
FIG. 3 is a diagram illustrating main components of the controller in FIG. 1.

FIG. 3 is a diagram illustrating main components of the controller 120 in FIG. 1.

Referring to FIG. 3, the word line grouping circuit 125 may group the plurality of word lines in the semiconductor memory device 110, into a plurality of word line groups based on information on program times (program timing information) of the respective word lines. Program timing information of the respective word lines may represent program times of cells coupled thereto.

An example of a point of time at which program times of the word lines in the semiconductor memory device 110 is measured is as follows.

For instance, program times of the word lines may be measured by a separate test tool in a test process for the semiconductor memory device 110, when manufacturing the semiconductor memory device 110.

For another instance, program times of the word lines may be measured at each cycle, which may be preset by the controller 120.

For still another instance, program times of the word lines may be measured in the case where the controller 120 receives, from the host 50, a command instructing it to measure program times of the word lines.

Further, an example of a position where information on program times of the word lines is stored is as follows.

For instance, such information may be stored in the semiconductor memory device 110, and the word line grouping circuit 125 may obtain the information on program times of the word lines which is stored in the semiconductor memory device 110.

For another instance, program timing information of the word lines may be stored in a storage within the controller 120 (e.g., the RAM 124 in the controller 120) or may be stored in a separate storage from the controller 120.

For still another instance, program timing information of the word lines may be included in firmware or setting information of the processor 122. In detail, program timing information of the word lines which is measured by a test tool in a test process for the semiconductor memory device 110 may be included in the firmware or the setting information of the processor 122. When the processor 122 drives the firmware, the program timing information of the word lines may be obtained from the firmware or the setting information of the processor 122.

Moreover, program timing information of the word lines may be configured as follows.

For instance, program timing information of the word lines may include program pulse count values applied to the word lines.

When data is programmed to each word line, a scheme such as an incremental step pulse programming (ISPP) may be used. In accordance with the ISPP scheme, an operation of applying a program pulse and then verifying a program result is repeatedly performed may be used.

Therefore, as a program pulse count, that is, the number of times a program pulse is applied in programming data, increases, total program time also increases. Thus, program times may be calculated by using program pulse count values of word lines.

As described above with reference to FIG. 1, the super page configuration circuit 126 may configure a plurality of super pages including some among the word lines in the semiconductor memory device 110, based on information on the word line groups generated by the word line grouping circuit 125.

In detail, the super page configuration circuit 126 may configure a super page such that word lines in one super page belong to the same word line group. To this end, the super page configuration circuit 126 may use the information on the word line groups grouped in the word line grouping circuit 125.

Configuring general super pages is described with reference to FIGS. 4 and 5, and examples in which super pages are configured by the super page configuration circuit 126 are described with reference to FIGS. 6 to 9.

When configuring super pages, the super page configuration circuit 126 may perform control such that, among the plurality of word lines in the semiconductor memory device 110, all word lines in any one among word line groups are included in any one super page. In this case, if any one word line belongs to a specific word line group, since the corresponding word line necessarily belongs to any one super page, it does not become a dummy word line.

On the other hand, when configuring super pages, the super page configuration circuit 126 may configure, as dummy word lines, at least some among word lines not included in any one of a plurality of super pages, among the plurality of word lines in the semiconductor memory device 110. Dummy data may be stored in a cell coupled to a word line which is configured as a dummy word line. An operation such as read and program may not be performed for the corresponding dummy word line. Therefore, if a word line having low performance (e.g., a word line having a substantially long program time) becomes a dummy word line, a delay that may occur as an operation such as read and program is performed for the corresponding word line may not be caused.

An example in which some word lines are configured as dummy word lines while super pages are configured by the super page configuration circuit 126 is described below with reference to FIG. 7, in accordance with an embodiment of the disclosure.

Moreover, when configuring super pages, if one among word lines configuring a super page is a bad word line, the super page configuration circuit 126 may select a replacement word line for the bad word line, in a word line group to which the bad word line belongs.

An example in which a replacement word line is determined in the case where at least one among word lines configuring a super page is a bad word line is described with reference to FIG. 9, in accordance with an embodiment of the disclosure. In FIGS. 4 to 9, it is assumed that four memory dies DIE0, DIE1, DIE2 and DIE3 are included in the semiconductor memory device 110 and four planes Plane0, Plane1, Plane2 and Plane3 are included in each memory die. Further, it is assumed that each memory die includes word lines WL0, WL1, WL2, WL3, WL4, WL5, WL6, WL7, . . . .

However, it is to be noted that the invention is not limited to the specific numbers of memory dies and planes assumed in the description of FIGS. 4 to 9; rather, such numbers represent one example. The numbers of memory dies, planes and word lines in the semiconductor memory device 110 are not limited to specific values, FIG. 4 is a diagram illustrating an example of configuring a conventional super page.

In this case, word lines which have the same word line index among the word lines in the respective memory dies may be included in one super page.

For example, a super page 0 SP0 may include the word line WL0 of the die DIE0, the word line WL0 of the die DIE1, the word line WL0 of the die DIE2 and the word line WL0 of the die DIE3. A super page 1 SP1 may include the word line WL1 of the die DIE0, the word line WL1 of the die DIE1, the word line WL1 of the die DIE2 and the word line WL1 of the die DIE3. A super page 2 SP2 may include the word line WL2 of the die DIE0, the word line WL2 of the die DIE1, the word line WL2 of the die DIE2 and the word line WL2 of the die DIE3. A super page 3 SP3 may include the word line WL3 of the die DIE0, the word line WL3 of the die DIE1, the word line WL3 of the die DIE2 and the word line WL3 of the die DIE3. A super page 4 SP4 may include the word line WL4 of the die DIE0, the word line WL4 of the die DIE1, the word line WL4 of the die DIE2 and the word line WL4 of the die DIE3.

In the case where a super page is configured in a manner described above, program times of word lines in one super page are not considered.

With reference to FIGS. 5 to 9, configurations of super pages in consideration of program times of word lines is described.

Hereinbelow, with reference to FIGS. 5 to 9, a case where word lines are grouped into two word line groups based on program times is described as an example. Each of word lines belonging to a word line group 1 WL Group 1 has a program time tPROG shorter than or equal to a threshold time value Thr. Each of word lines belonging to a word line group 2 WL Group 2 has a program time tPROG longer than the threshold time value Thr. In the case where information on program times includes program pulse count values, the threshold time value Thr may also be indicated by a program pulse count value.

In embodiments of the disclosure, the number of word line groups is not limited to a specific value, and word lines may be grouped into two or more word line groups.

Figure 5:
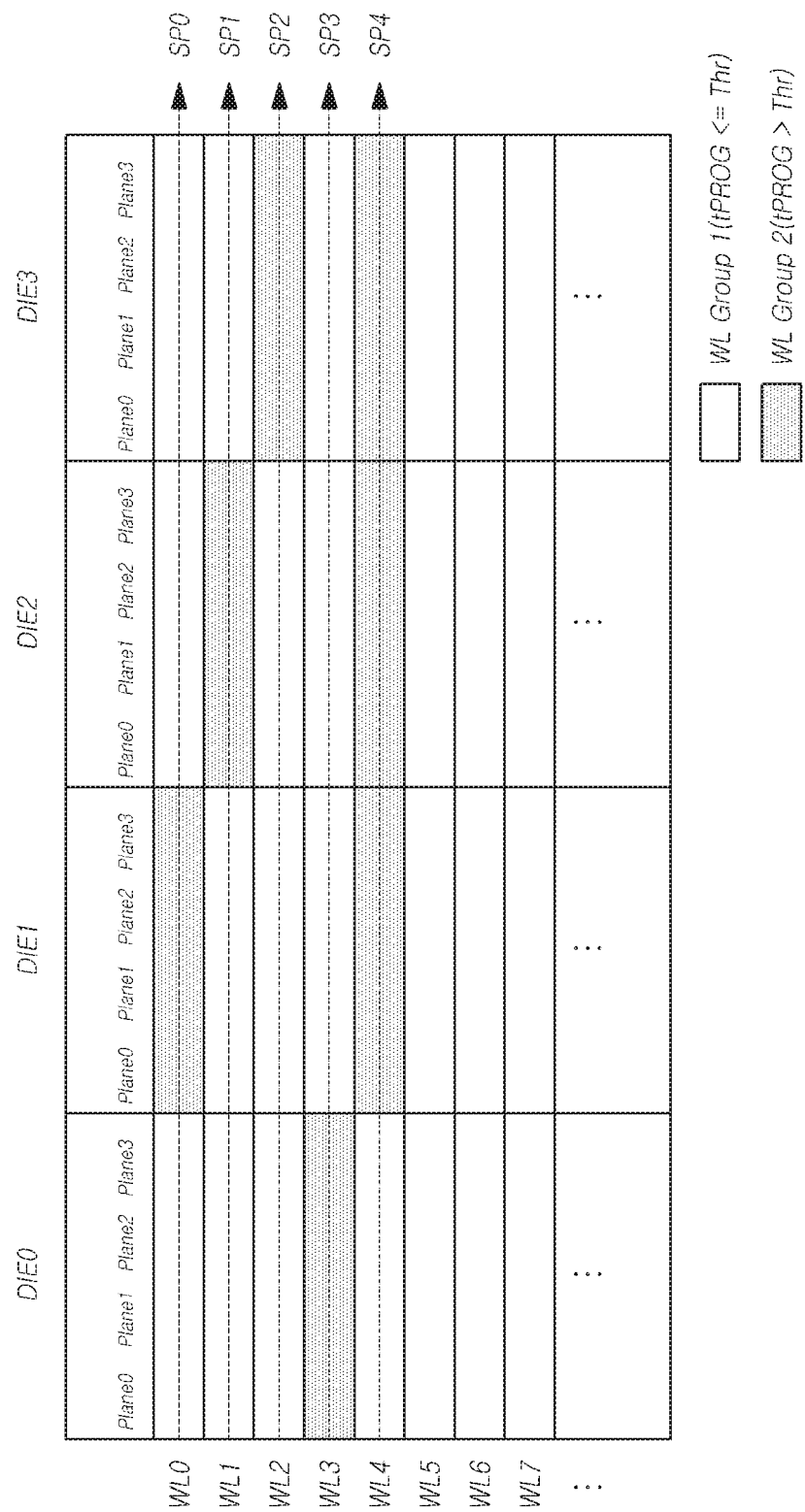
FIG. 5 is a diagram illustrating another example of configuring a conventional super page.

FIG. 5 is a diagram illustrating another example of configuring a conventional super page.

Referring to FIG. 5, in the same manner as in FIG. 4, word lines which have the same word line index in the respective memory dies may be configured as one super page.

All of super pages SP0, SP1, SP2, SP3 and SP4 include one or more word lines which belong to the word line group 2.

In detail, the super page 0 SP0 includes the word line WL0 of the die DIE1 which belongs to the word line group 2. The super page 1 SP1 includes the word line WL1 of the die DIE2 which belongs to the word line group 2.

As described above with reference to FIG. 1, because the overall program performance of a super page is determined by a word line of which the program time is longest, all of the super pages 0, 1, 2, 3 and 4 are degraded in their overall program performance due to the presence of word lines of which the program times are longest.

Therefore, in order to improve the overall program performance of a super page, it is necessary to configure a super page only by word lines of which the program times are shorter than or equal to a threshold time value and configure a super page only by word lines of which the program times are longer than the threshold time value, thereby optimizing the performance of the super pages.

Figure 6:
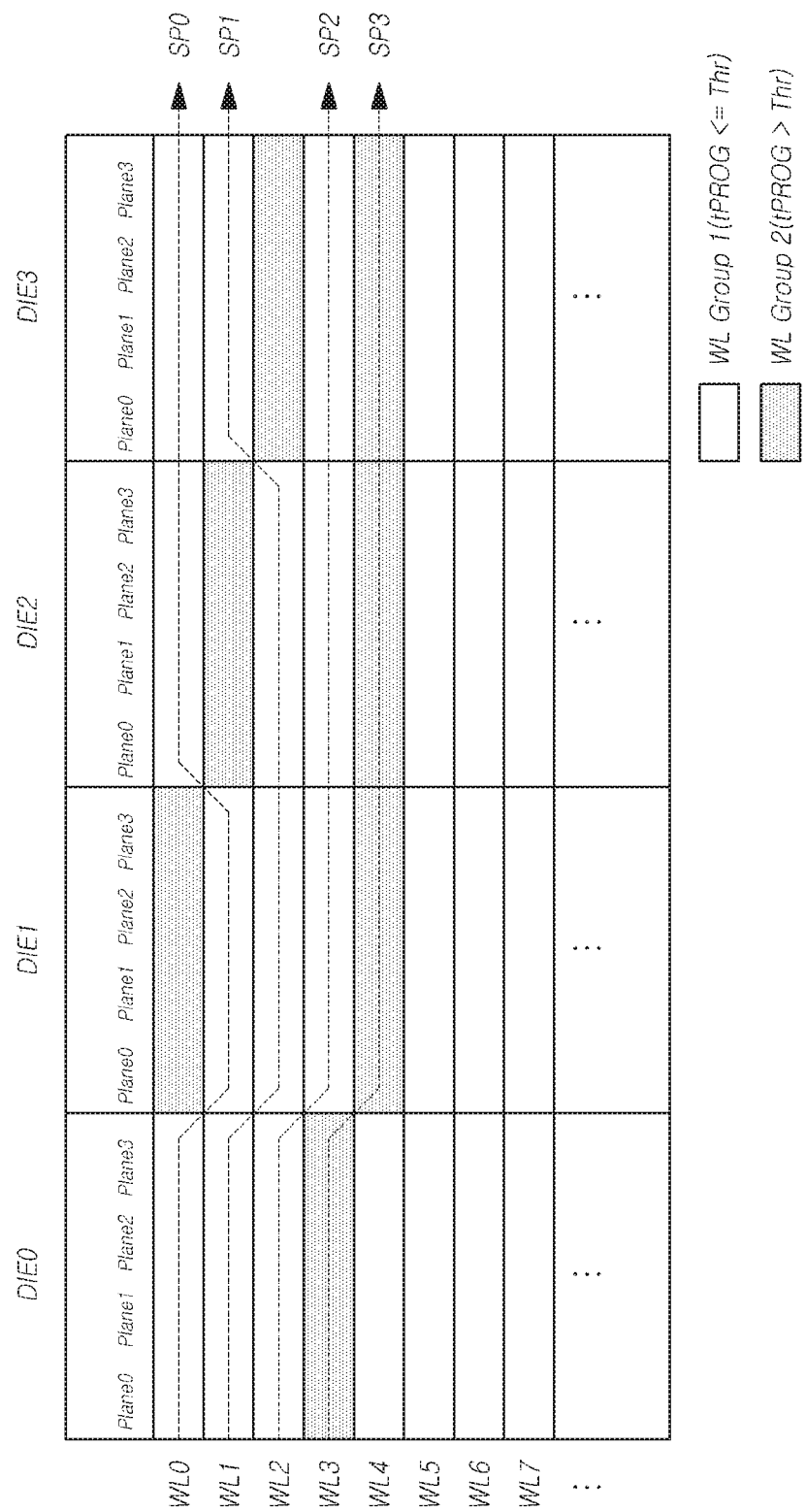
FIG. 6 is a diagram illustrating an example of configuring a super page in accordance with an embodiment.

FIG. 6 is a diagram illustrating an example of configuring a super page in accordance with an embodiment.

Referring to FIG. 6, all word lines in any one super page belong to the same word line group. That is to say, a super page includes only word lines of which the program times are shorter than or equal to a threshold time value, or includes only word lines of which the program times are longer than the threshold time value.

In FIG. 6, a super page 0 SP0 includes the word line WL0 of the die DIE0, the word line WL1 of the die DIE1, the word line WL0 of the die DIE2 and the word line WL0 of the die DIE3. Compared to the super page 0 of FIG. 5 which includes the word line WL0 of the die DIE1 as a word line of which the program time is longer than the threshold time value, all the word lines in the super page 0 of FIG. 6 are word lines of which the program times are shorter than or equal to the threshold time value.

In the same manner, the super page 1 SP1 includes the word line WL1 of the die DIE0, the word line WL2 of the die DIE1, the word line WL2 of the die DIE2 and the word line WL1 of the die DIE3, as word lines of which the program times are shorter than or equal to the threshold time value.

In the same manner, the super page 2 SP2 includes the word line WL2 of the die DIE0, the word line WL3 of the die DIE1, the word line WL3 of the die DIE2 and the word line WL3 of the die DIE3, as word lines of which the program times are shorter than or equal to the threshold time value.

In contrast to the super pages 0, 1 and 2, the super page 3 SP3 includes the word line WL3 of the die DIE0, the word line WL4 of the die DIE1, the word line WL4 of the die DIE2 and the word line WL4 of the die DIE3, as word lines of which the program times are longer than the threshold time value.

Namely, the super pages of FIG. 6 are different from those of FIG. 5 in that all word lines configuring each super page of FIG. 6 belong to the same word line group.

If super pages are configured as illustrated in FIG. 6, since all the super pages 0, 1 and 2 of FIG. 6 include only word lines of which the program times are shorter than or equal to the threshold time value, a performance degradation does not occur due to the presence of word lines of which the program times are longer than the threshold time value as in the super pages of FIG. 5. The super page 3 of FIG. 6 has the same program performance as the super page 3 of FIG. 5 since it includes the word lines of which the program times are longer than the threshold time value.

In other words, because the program performance of the super pages 0, 1 and 2 of FIG. 6 is improved as compared to the super pages 0, 1 and 2 of FIG. 5, it may be seen that, when super pages are configured as illustrated in FIG. 6, the overall program performance is improved as compared to when super pages are configured as illustrated in FIG. 5.

Figure 7:
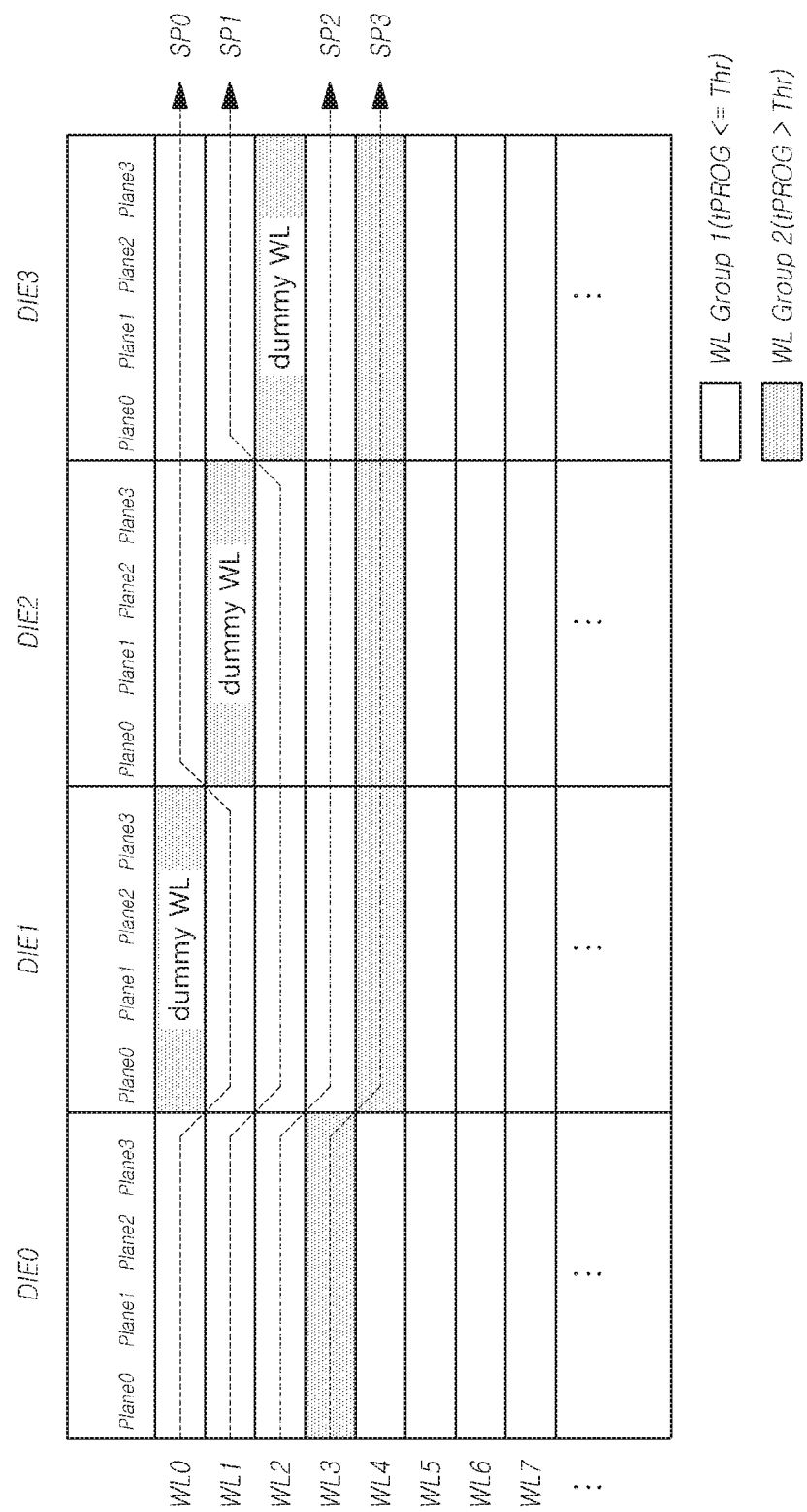
FIG. 7 is a diagram illustrating another example of configuring a super page in accordance with another embodiment.

FIG. 7 is a diagram illustrating another example of configuring a super page in accordance with an embodiment.

A method for configuring a super page in FIG. 7 is the same as the method for configuring a super page described above with reference to FIG. 6, but is different in that, when the super page configuration circuit 126 configures super pages, at least some among word lines not included in any one among super pages are configured as dummy word lines.

In detail, the word line WL0 of the die DIE1, the word line WL1 of the die DIE2 and the word line WL2 of the die DIE3 which do not belong to even any super page may be set as dummy word lines. To the dummy word lines, dummy data is programmed, and no valid data is programmed.

By way of example, with respect to a reference word line which corresponds to the same word line index as a dummy word line and is included in any one among a plurality of super pages, the super page configuration circuit 126 may configure a word line which belongs to a word line group different from a word line group to which the reference word line belongs, as the dummy word line. Namely, in this case, the dummy word line belongs to a word line group different from a word line group to which the reference word line belongs. For example, unlike that, among the word lines corresponding to the same word line index WL0, the word line WL0 of the die DIE0, the word line WL0 of the die DIE2 and the word line WL0 of the die DIE3 which belong to the super page 0 SP0 belong to the word line group 1, the word line WL0 of the die DIE1 belongs to the word line group 2. Therefore, the super page configuration circuit 126 may configure the word line WL0 of the die DIE1 belonging to a word line group different from the word line group 1 to which the word line WL0 of the die DIE0 selected as a reference word line belongs, as a dummy word line.

In the same way, the super page configuration circuit 126 may configure the word line WL1 of the die DIE2 not belonging to the word line group 1 to which a reference word line WL1 of the die DIE0 belonging to the super page 1 SP1 belongs, as a dummy word line, among the word lines corresponding to a word line index WL1.

Since dummy data is programmed to a dummy word line, when programming data to the dummy word line, it is not necessary to narrowly form a width of a threshold voltage distribution of respective cells of the dummy word line by repeatedly applying a program pulse in the same manner as the ISPP.

Therefore, when data is programmed to a dummy word line, a number of program pulses applied to the dummy word line may be less than or equal to a threshold pulse count, which may be preset.

For example, when data is programmed to a dummy word line in the case where the threshold pulse count is 1, a program bias may be applied only once to a control gate (CG) of each cell connected to the dummy word line.

In this way, when programming data to a dummy word line, by limiting the number of program pulses to be applied to the dummy word line, a time required to program data to the dummy word line may be shortened, and an amount of current generated when programming data to the dummy word line may be reduced.

Figure 8:
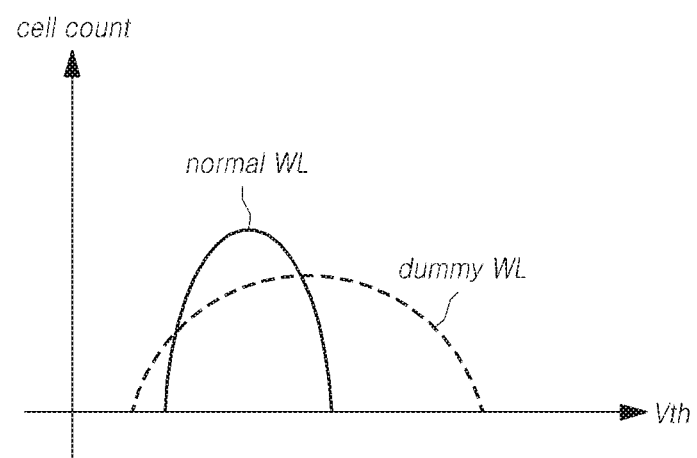
FIG. 8 is a diagram illustrating an example of threshold voltage distributions of a dummy word line and a normal word line in FIG. 7.
Figure 9:
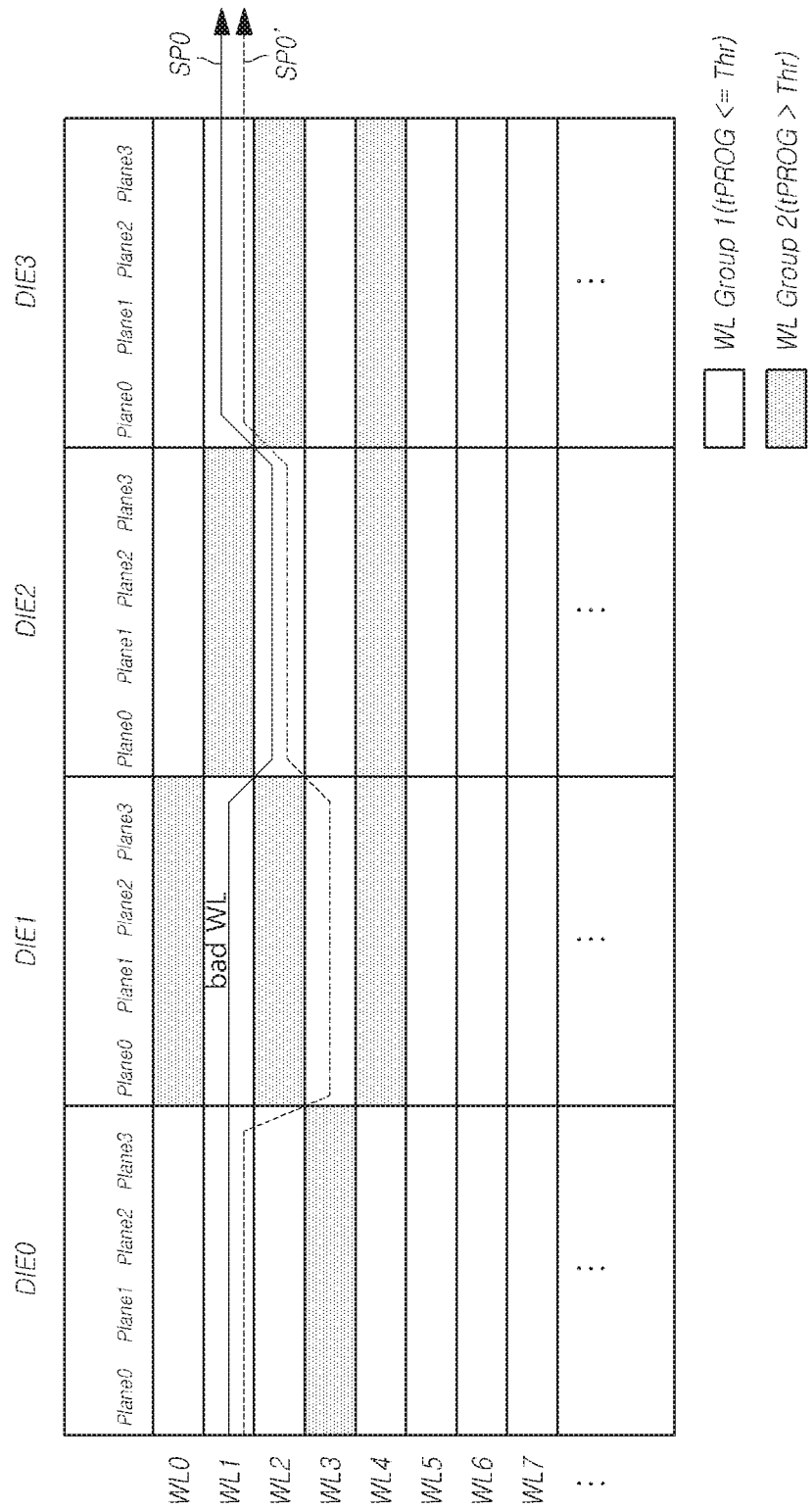
FIG. 9 is a diagram illustrating still another example of configuring a super page in accordance with an embodiment.

FIG. 8 is a diagram illustrating an example of threshold voltage distributions of a dummy word line and a normal word line in FIG. 7.

Referring to FIG. 8, in the case of a dummy word line "dummy WL", since the number of program pulses to be applied is limited, a width of a threshold voltage distribution of respective cells is wide. On the other hand, in the case of a normal word line "normal WL" to which valid data may be programmed unlike the dummy word line, since a program pulse may be applied several times, a width of a threshold voltage distribution of respective cells is narrow.

FIG. 9 is a diagram illustrating still another example of configuring a super page in accordance with an embodiment.

It is assumed that the super page 0 SP0 includes the word line WL1 of the die DIE0, the word line WL1 of the die DIE1, the word line WL2 of the die DIE2 and the word line WL1 of the die DIE3.

A bad word line may occur among word lines configuring a super page. If data is programmed to a bad word line, a program fail may occur. Thus, a bad word line cannot be included in a super page.

In FIG. 9, it is assumed that, among the word lines configuring the super page 0, the word line WL1 of the die DIE1 is a bad word line.

In this case, the super page configuration circuit 126 may newly configure a super page 0' SP0' by selecting a replacement word line for the word line WL1 of the die DIE1 being a bad word line.

The super page configuration circuit 126 may select the replacement word line for the word line WL1 of the die DIE1 being a bad word line, in the word line group 1 to which the bad word line belongs.

In detail, since the word line WL0 of the die DIE1 and the word line WL2 of the die DIE1 adjacent to the word line WL1 of the the DIE1 are word lines belonging to the word line group 2, they do not belong to the word line group 1 to which the word lines belonging to the super page 0 belong. If the word line WL0 of the die DIE1 or the word line WL2 of the die DIE1 is selected as the replacement word line, the program performance of the super page 0 is degraded due to the presence of the replacement word line.

Therefore, the super page configuration circuit 126 may select the word line WL3 of the die DIE1 belonging to the word line group 1 to which the bad word line WL1 of the die DIE1 belongs, instead of the word line WL0 of the die DIE1 and the word line WL2 of the die DIE1, as the replacement word line. In this case, since the newly configured super page 0' includes only word lines of which the program times are shorter than or equal to the threshold time value, it is possible to prevent program performance degradation.

Figure 10:
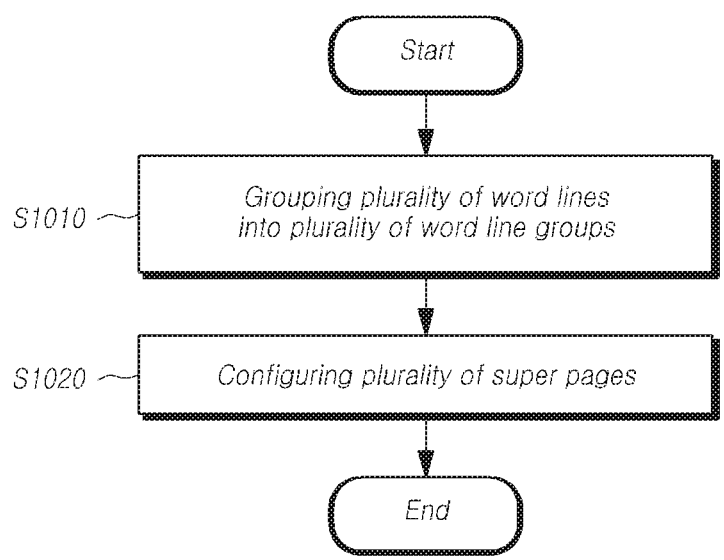
FIG. 10 is a flow chart illustrating a method for operating a controller in accordance with an embodiment.

FIG. 10 is a flow chart illustrating a method for operating the controller 120 in accordance with an embodiment.

Such method is described in the context of being executed by the controller 120 in the storage device 100 described above with reference to FIG. 1.

Referring to FIG. 10, first, the word line grouping circuit 125 of the controller 120 may group a plurality of word lines in the semiconductor memory device 110 into a plurality of word line groups based on program timing information of the respective word lines (S1010).

As aforementioned, the program timing information may include program pulse count values.

The super page configuration circuit 126 of the controller 120 may configure a plurality of super pages including some among the plurality of word lines in the semiconductor memory device 110, based on the program timing information on the word line groups generated by the word line grouping circuit 125 (S1020). Word lines in any one super page may belong to the same word line group.

On the other hand, as described above with reference to FIG. 7, the super page configuration circuit 126 may configure, as dummy word lines, at least some among word lines not included in any one of a plurality of super pages, among the plurality of word lines in the semiconductor memory device 110.

A dummy word line may belong to, with respect to a reference word line which corresponds to the same word line index as the dummy word line and is included in any one among a plurality of super pages, a word line group different from a word line group to which the reference word line belongs.

When programming dummy data to a dummy word line, the number of program pulses to be applied to the dummy word line may be less than or equal to a threshold pulse count, which may be preset.

Moreover, as described above with reference to FIG. 9, if one among word lines configuring a super page is a bad word line, the super page configuration circuit 126 may select a replacement word line for the bad word line, in a word line group to which the bad word line belongs.

As is apparent from the above description, through the embodiments of the disclosure, a storage device, a controller and a method for operating a controller, capable of minimizing program performance degradation that may occur due to deviations in program time among word lines, may be provided.

Although embodiments of the disclosure have been illustrated and described, those skilled in the art will appreciate in light of the present disclosure that various modifications, additions and substitutions are possible, without departing from the scope and spirit of the invention. Therefore, the embodiments disclosed herein should be considered in a descriptive sense only and not for limiting the technological scope. The spirit and scope of the invention is defined by the appended claims and their equivalents.

What is claimed is:

1. A controller suitable for controlling a semiconductor memory device, comprising:
a word line grouping circuit configured to group a plurality of word lines in the semiconductor memory device into a plurality of word line groups based on program timing information on program times of the respective word lines; and
a super page configuration circuit configured to configure a plurality of super pages including some of the word lines, based on word line group information on the word line groups,
wherein word lines in any one super page belong to the same word line group,
wherein the super page configuration circuit configures, as a dummy word line, at least one of word lines not included in any one among the super pages, among the plurality of word lines based on the program timing information of the respective word lines, and
wherein the dummy word lines are programmed with dummy data.

2. The controller according to claim 1, wherein the program timing information includes program pulse count values.

3. The controller according to claim 1, wherein the dummy word line belongs to a word line group different from a reference word line group to which a reference word line belongs, the reference word line corresponding to the same word line index as the dummy word line is included in any one among the plurality of super pages.

4. The controller according to claim 1, wherein, when programming dummy data to the dummy word line, a number of program pulses to be applied to the dummy word line is less than or equal to a threshold pulse count.

5. The controller according to claim 1, wherein, if one among word lines which configure any one super page is a bad word line, the super page configuration circuit selects a replacement word line for the bad word line in a word line group to which the bad word line belongs.

6. The controller according to claim 1, wherein the super page configuration circuit controls such that each of word lines in any one among the word line groups is included in any one super page.

7. A storage device comprising:
a semiconductor memory device including a plurality of word lines; and
a controller configured to control the semiconductor memory device,
wherein the controller comprises:
a word line grouping circuit configured to group the plurality of word lines, into a plurality of word line groups based on program timing information on program times of the respective word lines; and
a super page configuration circuit configured to configure a plurality of super pages including some of the word lines, based on word line group information on the word line groups,
wherein word lines in any one super page belong to the same word line group,
wherein the super page configuration circuit configures, as a dummy word line, at least one of word lines not included in any of the super pages, among the plurality of word lines based on the program timing information of the respective word lines, and
wherein the dummy word lines are programmed with dummy data.

8. The storage device according to claim 7, wherein the program timing information includes program pulse count values.

9. The storage device according to claim 7, wherein the dummy word line belongs to a word line group different from a reference word line group to which a reference word line belongs, the reference word line corresponding to the same word line index as the dummy word line is included in any one among the plurality of super pages.

10. The storage device according to claim 7, wherein, when programming dummy data to the dummy word line, a number of program pulses to be applied to the dummy word line is less than or equal to a threshold pulse count.

11. The storage device according to claim 7, wherein, if one among word lines which configure any one super page is a bad word line, the super page configuration circuit selects a replacement word line for the bad word line in a word line group to which the bad word line belongs.

12. The storage device according to claim 7, wherein the super page configuration circuit controls such that each of word lines in any one of the word line groups is included in any one super page.

13. A storage device comprising:
a memory device including a plurality of memory cells coupled to a plurality of word lines; and
a controller suitable for:
determining program pulses to be applied to the word lines respectively;
grouping the plurality of word lines into a plurality of groups based on the program pulses;
configuring a super page including cells coupled to selected word lines in each of the groups; and
programming data on the super page,
wherein at least one of word lines not included in any of the super pages, among the plurality of word lines is configured as a dummy word line based on the program pulses of the respective word lines, and
wherein the dummy word lines are programmed with dummy data.

* * * * *